United States Patent [19]
Nabeshima et al.

[11] Patent Number: 5,489,847
[45] Date of Patent: Feb. 6, 1996

[54] RF PROBE FOR MRI

[75] Inventors: Takayuki Nabeshima, Kokubunji; Tetsuhiko Takahashi, Soka; Yoshikuni Matsunaga, Kashiwa; Etsuji Yamamoto, Akishima; Kageyoshi Katakura, Tokyo, all of Japan

[73] Assignees: Hitachi, Ltd.; Hitachi Medical Corp., both of Tokyo, Japan

[21] Appl. No.: 252,624

[22] Filed: Jun. 1, 1994

[30] Foreign Application Priority Data

Jun. 8, 1993 [JP] Japan ................... 5-137241

[51] Int. Cl.⁶ ........................................ G01V 3/00
[52] U.S. Cl. ................................ 324/318; 324/322
[58] Field of Search ............................. 324/318, 322, 324/314, 307, 309, 300; 128/653.5

[56] References Cited

U.S. PATENT DOCUMENTS 5,003,265  3/1991  Leussler ......................... 324/318

FOREIGN PATENT DOCUMENTS 2500175  1/1990  Japan .

OTHER PUBLICATIONS

P. B. Roemer "The NMR Phased Array" Magnetic Resonance in Medicine 16, pp. 192–225 (1990) (mo. unknown).

Primary Examiner—Louis M. Arana
Attorney, Agent, or Firm—Antonelli, Terry, Stout & Kraus

[57] ABSTRACT

An RF probe for MRI, in which a plurality of unit coils including conductive loops having resonance capacitors and inductors connected with the conductive loops in series are arranged so as to be distant from each other with a predetermined distance, electromagnetic coupling being produced between at least two inductors to remove electromagnetic coupling between the unit coils.

34 Claims, 11 Drawing Sheets

RF PROBE FOR MRI

BACKGROUND OF THE INVENTION

The present invention relates to a magnetic resonance imaging (hereinbelow abbreviated to MRI) apparatus, in which nuclear magnetic resonance (hereinbelow abbreviated to NMR) signals coming from hydrogen, phosphor, etc. in a subject are measured to provide an image density distribution of nuclei, relaxation time distribution, etc., as well as an RF probe for MRI suitable for use for a signal detecting section in an MRI apparatus.

In an MRI apparatus, signals coming from an interested part of a subject (e.g. human being) are detected by means of a resonance type high frequency coil. As a method for increasing sensitivity of the coil, there is known a method, by which a plurality of coils are juxtaposed and signals obtained by the different coils are joined to synthesize an NMR signal. The principle of this method is described in JP-A-Hei 2-500175 or Magnetic Resonance in Medicine, Vol. 16, pp. 192–225 (1990).

By the prior art techniques, if outputs of a probe are simply joined to detect a synthesized signal, since signal to noise ratio (S/N ratio) is not increased, it is necessary to detect the plurality of outputs of the probe separately in order to increase the S/N ratio. For this reason electromagnetic coupling between different coils should be removed to reduce correlation of noise between different coils. However, when coupling between different coils is strong, there is no means for removing stably electromagnetic coupling between different coils. Therefore there was a problem that it was not possible to reduce satisfactorily the correlation of noise between different coils.

SUMMARY OF THE INVENTION

The object of the present invention is to provide an RF probe for MRI having a mechanism capable of easily removing electromagnetic coupling between different coils, even if it is strong, and further to provide an MRI apparatus having a high sensitivity, using it.

The above object is achieved by arranging a plurality of unit coils having an approximately same resonance frequency closely to each other, each of the unit coils being composed of a resonance type RF probe for MRI consisting of a conductive loop, a capacitor for resonance and an inductor connected with the conductive loop in series, wherein the unit coils are so arranged that electromagnetic coupling is produced between different inductors which are connected to each of the conductive loops so as to compensate electromagnetic coupling between different conductive loops, which reduces, in turn, electromagnetic coupling between the different unit coils.

That is, an RF probe for MRI comprises a plurality of unit coils, each of which is consisting of a conductive loop having a capacitor for resonance and an inductor connected with the conductive loop in series, wherein electromagnetic coupling is produced between at least two inductors so as to remove electromagnetic coupling between different unit coils, inductors used therefor being air-core coils.

A QD probe can be constructed, in which an RF magnetic field in a first direction (e.g. x direction) is detected by the RF probe for MRI described above and a second RF magnetic field, which is perpendicular to the direction of the first RF magnetic field, e.g. in the y direction, is detected by means of another RF probe, to which the present invention is applied. Concretely speaking, the first RF probe for MRI is a solenoid coil or a solenoid array coil and the second RF probe for MRI is a saddle type coil or a saddle type array coil. Further the RF coil for MRI explained above may be used for detecting signals in an MRI apparatus or for generating an RF magnetic field. It may be used further for imaging a breast or a jaw joint. Furthermore electromagnetic coupling of inductance may be effected through an auxiliary conductive loop using a cable, etc. or a plurality of inductors may be arranged most closely to the respective conductive loops, with which the inductors are connected.

According to the present invention, electromagnetic coupling between a plurality of coils can be removed by electromagnetic coupling between the inductors connected with the coils. As the result, no correlation of noise is produced between the different coils and thus it is possible to provide an RF probe for MRI capable of detecting signals with a high S/N ratio in a large field of view.

According to the present invention, current flowing through the inductors is utilized for removing electromagnetic coupling between the plurality of coils. This method has a merit that e.g. this removal can be effected more stably than by a method, by which a circuit using a capacitor is utilized for removing the electromagnetic coupling, that only few regulation parameters are required therefor, etc. Furthermore, since the construction is simple, active decoupling or floating of the probe is easy.

DESCRIPTION OF THE PREFERRED EMBODIMENTS

Figure 1:
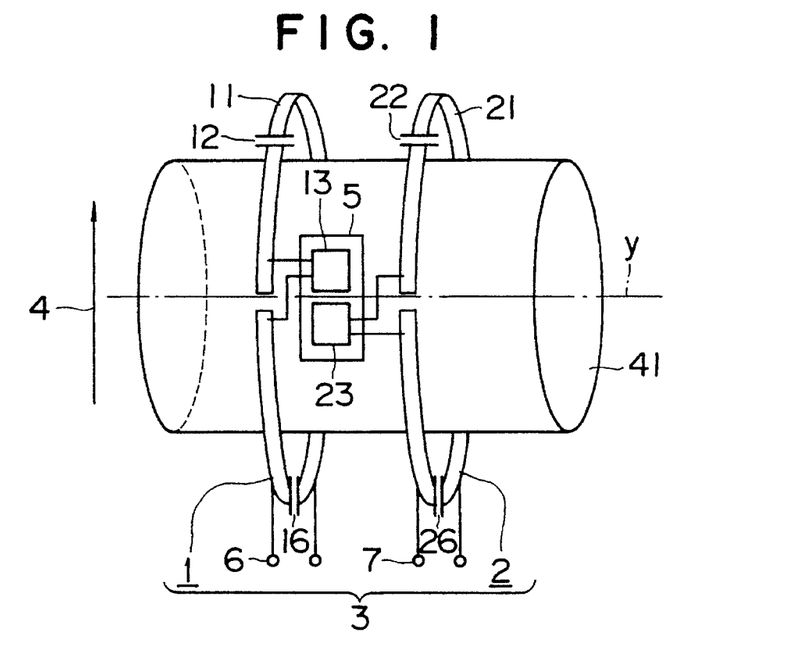
FIG. 1 is a diagram showing an embodiment of the RF probe according to the present invention.

FIG. 1 shows an example of a concrete shape of the resonance type RF probe, which is a first embodiment of the present invention. Coils 1 and 2 are circular loop coils having a diameter of 250 mm and a width of 25 mm. The central axes (Y axes) of the coils 1 and 2 are in accordance with each other and copper plates constituting the circular loop coils are superposed on each other with a distance of 125 mm between centers thereof. Conductive loops 11 and 21 are secured to a surface of a cylindrical bobbin made of acrylic resin not indicated in FIG. 1. Resonance capacitors 12 and 22 are connected with the conductive loops 11 and 21 in series, respectively, and 16 and 26 are capacitors for matching. Directions of RF magnetic fields produced by the resonance capacitors are in accordance with the direction of the central axes of the coils 1 and 2. A subject e.g. the head of a human being or a phantom simulating it is placed within the two conductive loops 11 and 21. Reference numerals 6 and 7 indicate feeding points. Strong static magnetic field 4 in an MRI apparatus intersects the direction of the central axes of the coils typically at a right angle, as indicated in FIG. 1. Since magnetic fields generated by the loops 11 and 21 are superposed on each other, coupling therebetween takes place and the degree thereof is determined by the distance between the two coils. Inductors 13 and 23, which are a feature of the present invention, are extended from the different conductive loops and placed so as to be extremely close to each other, as indicated in FIG. 1. The degree of closeness of the inductors 13 and 23 is regulated so that coupling between the inductors compensates coupling between the loops 11 and 21 described above. A magnetic shield 5 may be disposed between the inductors 13, 23 and the subject 41.

Figure 2A:
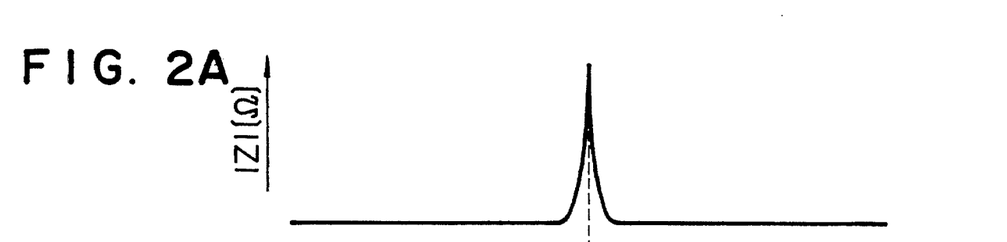
FIGS. 2A and 2B are diagrams for explaining frequency characteristics of a coil.
Figure 2B:
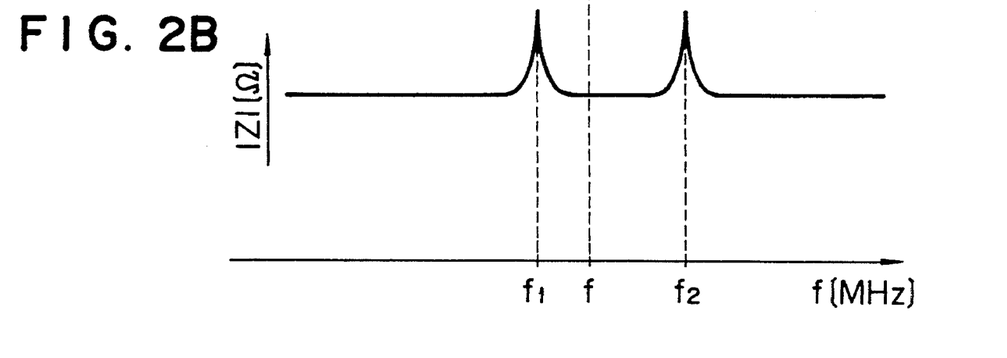

Generally, when two coils having a same resonance frequency have electromagnetic coupling, in impedance-frequency characteristics thereof, two resonance frequencies ($f_1$, $f_2$) different from the resonance frequency "f" in FIG. 2A, when they are separated from each other appear in each of the coils, as indicated in FIG. 2B. Even with the two coils as indicated in FIG. 1, in case where there are no inductors 13 and 23 (or there is no electromagnetic coupling between the inductors 13 and 23), they show frequency-impedance characteristics (f~|Z|) similar to those indicated in FIG. 2B.

Figure 3:
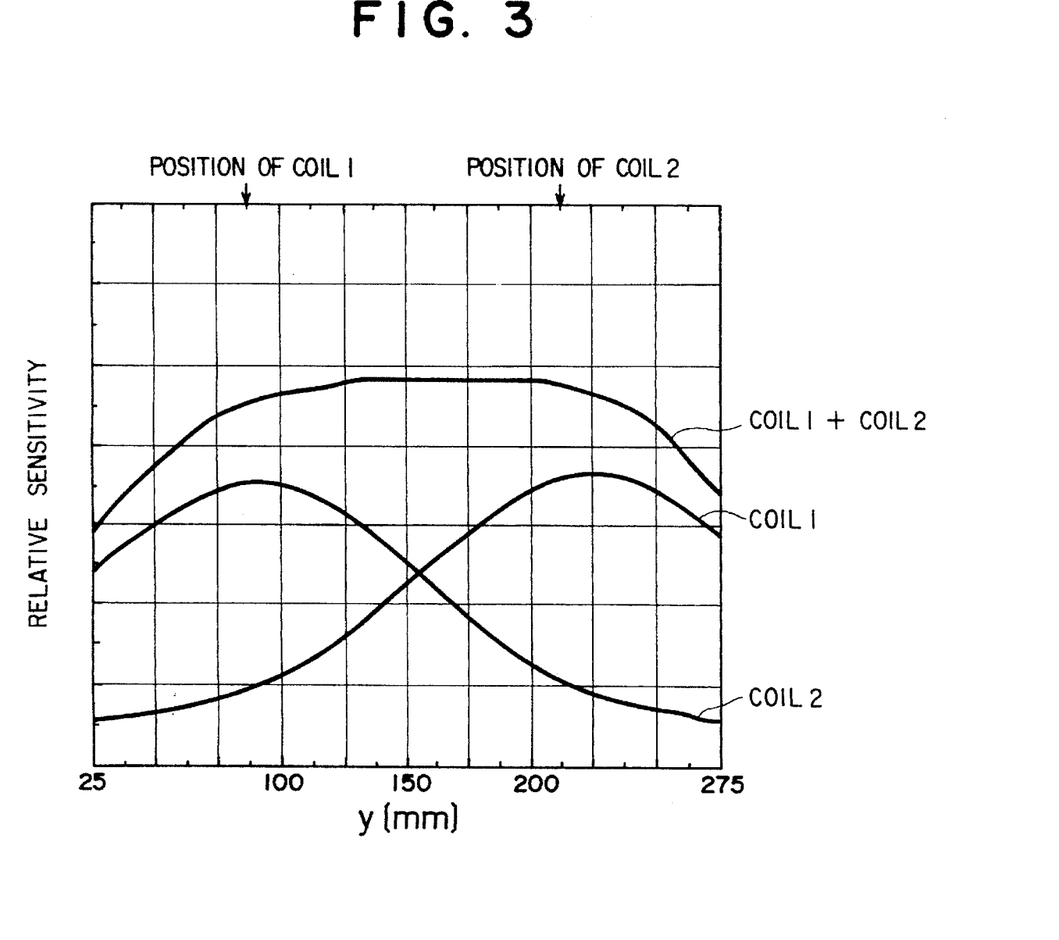
FIG. 3 is a diagram showing a sensitivity distribution of the RF probe indicated in FIG. 1.

In the embodiment indicated in FIG. 1, as a result that this correlation of noise was removed by the electromagnetic coupling between the inductors 13 and 23, frequency characteristics similar to those obtained by a single coil indicated in FIG. 2A were obtained. FIG. 3 shows measurement results obtained on sensitivity distribution in the Y axis direction of the coils 1 and 2 in the embodiment indicated in FIG. 1. As clearly seen from FIG. 3, the coils have distributions completely different from each other and thus it can be seen that there is no correlation of signal between the coils 1 and 2. Similarly it can be understood that there is no correlation of noise between the coils. It can be recognized that characteristics of a high sensitivity and a wide field of view in the axial direction are obtained, as indicated in FIG. 3, when such outputs of the two coils are joined.

Figure 4:
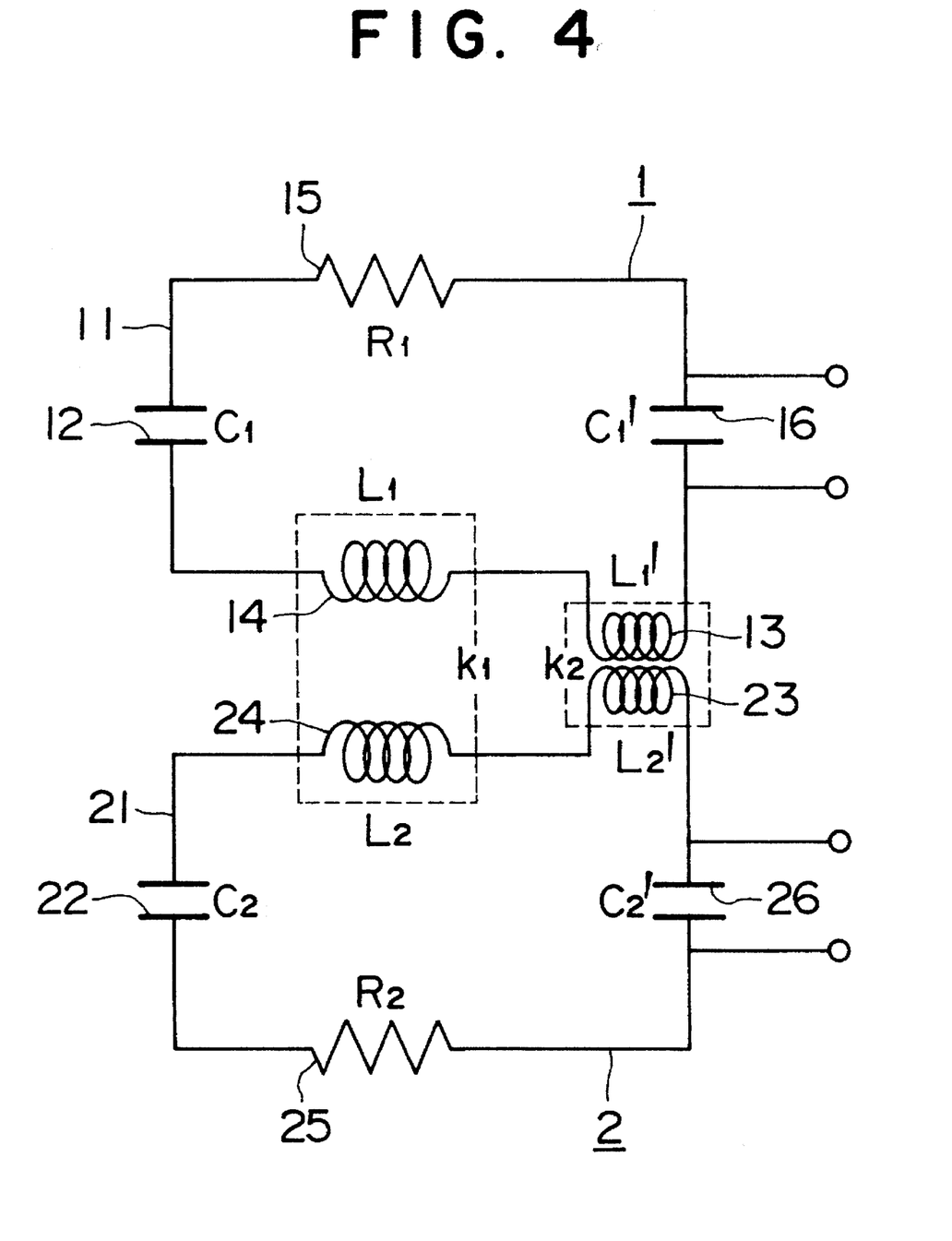
FIG. 4 is an equivalent circuit diagram of the RF probe indicated in FIG. 1.

FIG. 4 is an equivalent circuit diagram of the first embodiment of the present invention. The coil 1, which is a resonance type RF probe for MRI, consists of a conductive loop 11, a resonance capacitor 12 (capacitance $C_1$) and an inductor 13 (inductance $L_{1'}$) connected with the conductive loop in series. Distributed constants of the conductive loop 11 are represented by an equivalent inductor 14 (inductance $L_1$) and an equivalent resistor 15 (resistance $R_1$). Further the capacitor 12 (capacitance $C_1'$) is a capacitor connected for parallel resonance and impedance matching.

The coil 2 consists of a conductive loop 21, a resonance capacitor 22 (capacitance $C_2$) and an inductor 23 (inductance $L_2'$) connected with the conductive loop in series. Distributed constants of the conductive loop 21 are represented by an equivalent inductor 24 (inductance $L_2$) and an equivalent resistor 25 (resistance $R_2$). There exists a mutual inductance $M_1$ between the coils 1 and 2 having an electromagnetic coupling, which is given by $M_1^2 = k_1^2(L_1 L_2)$ ($k_1$ being a coupling constant between $L_1$ and $L_2$), using inductances $L_1$ and $L_2$ of the equivalent inductors 14 and 24. In the present embodiment the electromagnetic coupling between the coils 1 and 2 is removed by using a mutual inductance $M_2$ between the inductors 13 and 23 having an electromagnetic coupling, which is given by $M_2^2 = k_2^2(L_{1'} L_{2'})$ ($k_2$ being a coupling constant between $L_{1'}$ and $L_{2'}$) and by regulating various constants so that $|M_1|=|M_2|$. At this time the inductors 13 and 23 are coupled so that direction of current induced in the inductor 24 by the inductor 14 is opposite to direction of current induced in the inductor 23 by the inductor 13. The inductances $L_{1'}$ and $L_{2'}$ are preferably about 0.1~3 times as great as the equivalent inductances $L_1$ and $L_2$. The reason therefor is that, when $L_{1'}$ and $L_{2'}$ are too small with respect to $L_1$ and $L_2$, even if $k_2$ is as great as the theoretical maximum value (=1), $|M_1|>|M_2|$ and it is not possible to achieve the condition described above ($|M_1|=|M_2|$), which makes it impossible to remove the electromagnetic coupling. On the contrary, when $L_{1'}$ and $L_{2'}$ are too great with respect to $L_1$ and $L_2$, radiation loss due to it and conductor loss due to increasing length of the coils become non-negligible, and since this lowers output sensitivity, which gives rise to a problem in practice, this is not preferable.

In case where these resonance coils 1 and 2 are used as an RF probe for proton ($^1$H) in a static magnetic field of 0.3 T, the resonance frequency is 12.78 MHz. $C_1$ and $C_2$ are 120 pF; $C_{1'}$ and $C_{2'}$ are 2060 pF; $L_{1'}$ and $L_{2'}$ are 0.91 μH. The inductors 13 and 23 are cylindrical air-core coils having 10 turns and a diameter of 15 mm made of copper wire coated with enamel of 1 mmφ. The Q value of the resonance coils 1 and 2 is about 190, when there is a subject, i.e. with load. $L_1$ and $L_2$ are 0.42 μH and $R_1$ and $R_2$ are 0.22 Ω, which are equivalent distributed constants. Consequently the inductance $L_{1'}$ (or $L_{2'}$) of the inductor 13 is about 2.2 times as great as the inductance $L_1$ (or $L_2$).

Figure 5:
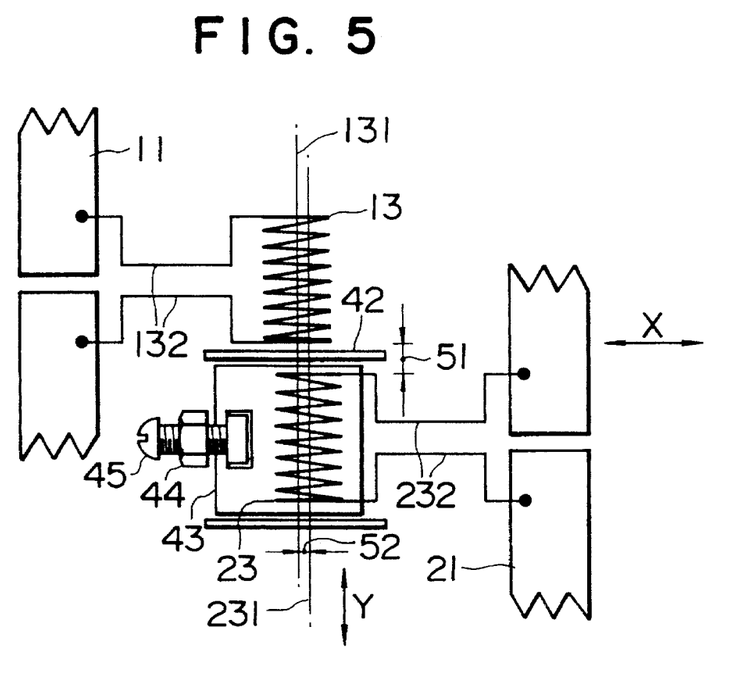
FIG. 5 shows a concrete example of an inductor indicated in FIG. 1.

FIG. 5 shows a concrete example of the inductors 13 and 23 indicated in FIG. 1. Both the inductors 13 and 23 are air-core coils having 10 turns and a diameter of 15 mm made of wire of 1 mmφ described previously. The central axis 131 of the inductor 13 is approximately in accordance with the central axis 231 of the inductor 23 and the distance between the inductors 13 and 23 is 3~4 mm. A wire 132 connecting the inductor 13 with the conductive loop 11 and a wire 232 connecting the inductor 23 with the conductive loop 21 are so disposed that the interval between the going and the returning line thereof is as small as possible in order that unnecessary magnetic flux giving rise to induction current doesn't pass therethrough. It was found that preferably the number of turns of the air-core coils is 1~10, the cross-sectional area thereof is 10~10,000 mm$^2$, and the cross-sectional area of the wire constituting the air-core coils is 3~100 mm$^2$. However the air-core coils are not necessarily circular, but they may be rectangular or they may have any other shapes.

Next a method for regulating the coupling coefficients of the inductors will be explained. The electromagnetic coupling between the inductors 13 and 23 can be easily varied to be regulated from the exterior by moving the inductors 13 and 23 to vary the distance 51 therebetween or by displacing the central axis 131 of the inductor 13 and the central axis 231 of the inductor 23 to change the distance 52 therebetween. Any well-known techniques such as a sliding mechanism using a screw, etc. can be utilized for the moving mechanism. Taking it into account that the moving mechanism is used in strong magnetic field, it is preferably made of a non-magnetic material, e.g. acrylic resin, etc. Driving of the screw for the moving mechanism may be manual or automatic. An ultra-sonic motor can be utilized for automatic driving. For the automatic driving it is possible also to regulate automatically interaction between the coils for each subject, which interaction varies slightly, depending on the shape of the subject.

Figure 8A:
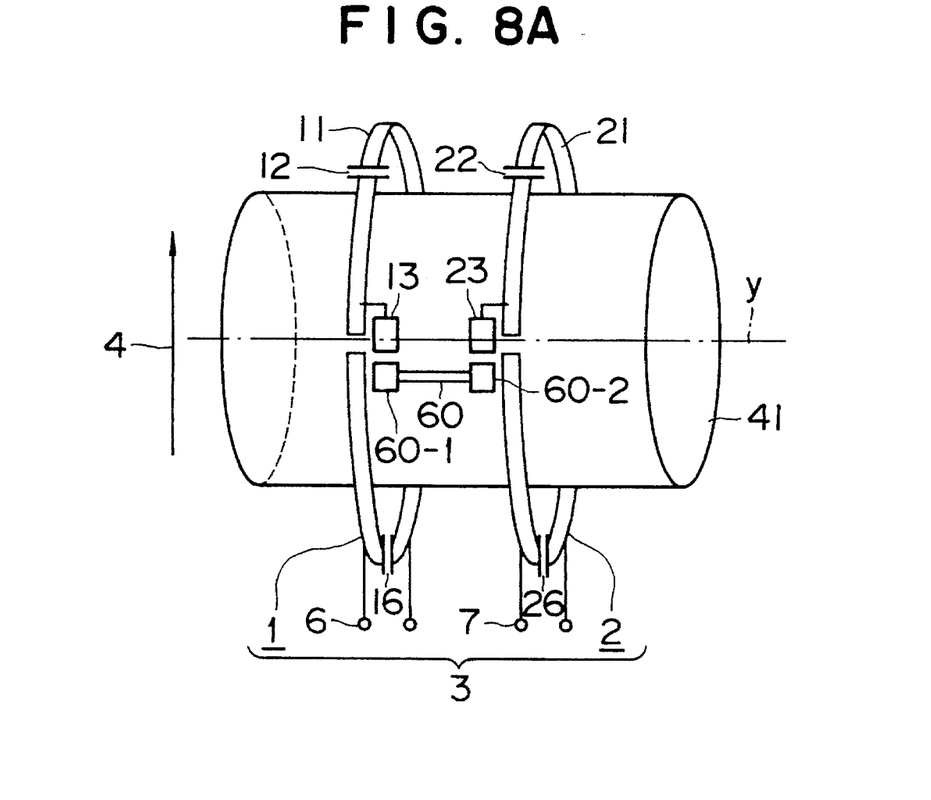
FIG. 8A is a diagram showing another embodiment of the RF probe according to the present invention.
Figure 8B:
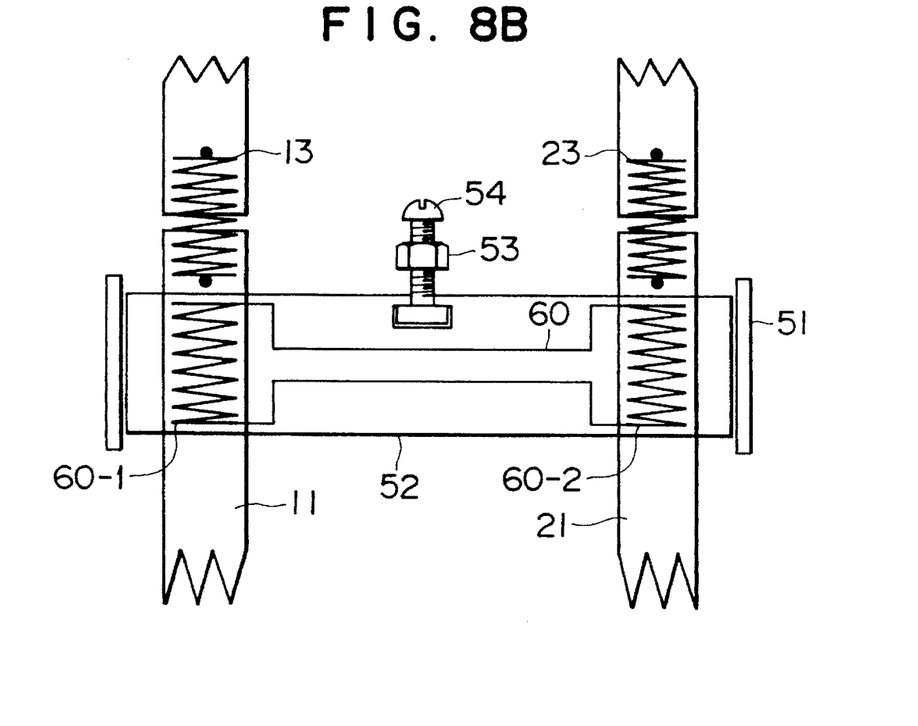
FIG. 8B shows a concrete example of an inductor portion in FIG. 8A.

FIG. 5 shows a construction for regulating the distance 52. It is so constructed that a moving base 43 securing the inductor 23 can be moved to left and right along a guide 42 by turning a screw 45. The screw 45 is held by a support 44 secured to a casing. The distance 51 can be regulated also by a construction similar thereto and an example thereof is indicated in FIGS. 8A and 8B. Details are explained afterwards.

According to the present invention it is preferable that the direction "X" of the RF magnetic field detected (or generated) by the conductive loops 11, 21 and the direction "Y" of the main magnetic field detected (or generated) by the inductors 13, 23 are arranged so as to intersect perpendicularly to each other. In this case, since no induced current is produced in the inductors 13, 23 by the RF magnetic field, the electromagnetic coupling between the different inductors is not influenced by the RF magnetic field and therefore it is stable. Although in the present embodiment the inductors 13, 23 for eliminating the electromagnetic coupling are disposed in the neighborhood of the coils 11, 21, outputs of the different coils may be taken out through cables 132, 232 and the inductors 13, 23 for eliminating the electromagnetic coupling may be disposed midway on the respective cables. In case where cylindrical coils are used, they may be disposed in an arrangement other than the arrangement of the conductors indicated in FIG. 5, as explained below.

Figure 6:
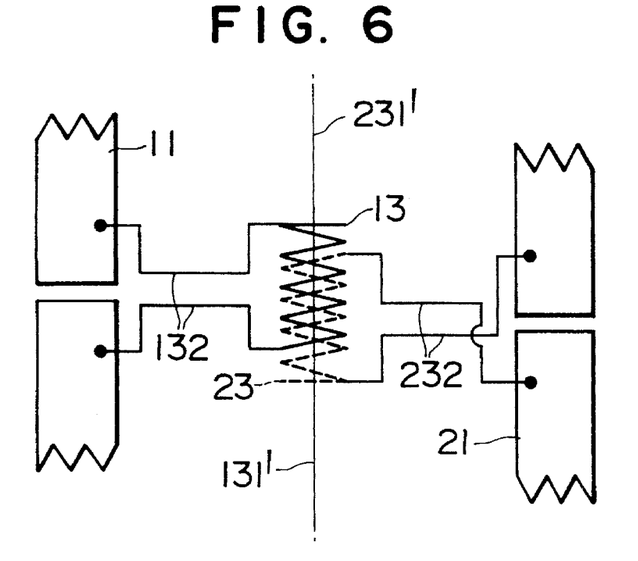
FIG. 6 shows another concrete example of an inductor indicated in FIG. 1.

FIG. 6 shows another embodiment of the inductors 13, 23 indicated in FIG. 1. FIG. 6 shows an example, in which two air-core coils are arranged so that every turn of one of them is put between two adjacent turns of the other except at the end portions. At this time, regulation of the relative position of the two air-core coils can be effected by displacing the central axis 131' of the inductor 13 and the central axis 231' of the inductor 23 (the central axes 131', 231' being in accordance with each other in FIG. 6), similarly to the embodiment indicated in FIG. 5.

Figure 7:
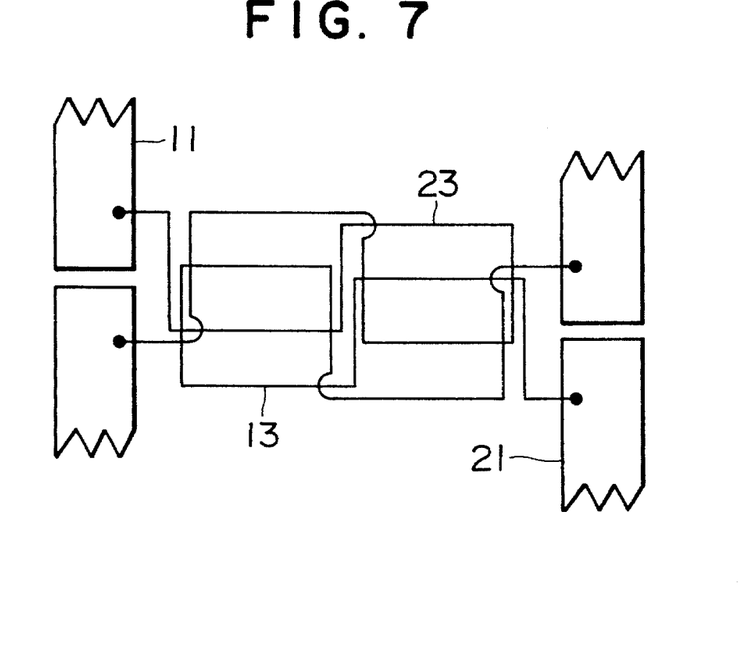
FIG. 7 shows still another concrete example of an inductor indicated in FIG. 1.

FIG. 7 shows still another embodiment of the inductors 13, 23 indicated in FIG. 1. Apart from the cylindrical coils, 8-shaped coils, as indicated in FIG. 7, may be used also for the inductors 13 and 23. The present embodiment is characterized in that the inductors produce no induced current for an RF magnetic field spatially uniform. Consequently it is possible to realize a stable probe, which is not influenced by external situations. Also in this case, the coupling constant $k_2$ can be regulated by varying the relative position thereof, similarly to the embodiments indicated in FIGS. 5 and 6.

FIG. 8A shows still another embodiment of the present invention. What is different in the present embodiment from the embodiment indicated in FIG. 5 is that the electromagnetic coupling of the inductors is effected through an auxiliary coil 60. Electromagnetic coupling is effected between inductors 13 and 60-1 and between inductors 23 and 60-2, as indicated in FIG. 8B.

When a screw 54 is rotated, a moving base 52, to which the inductors 60-1, 60-2 and the auxiliary coil 60 are secured, is moved along a guide 51 and in this way coupling is regulated between the inductors 13 and 60-1 and between the inductors 23 and 60-2. 53 is a support for the screw 54, which is secured to a casing.

Figure 9A:
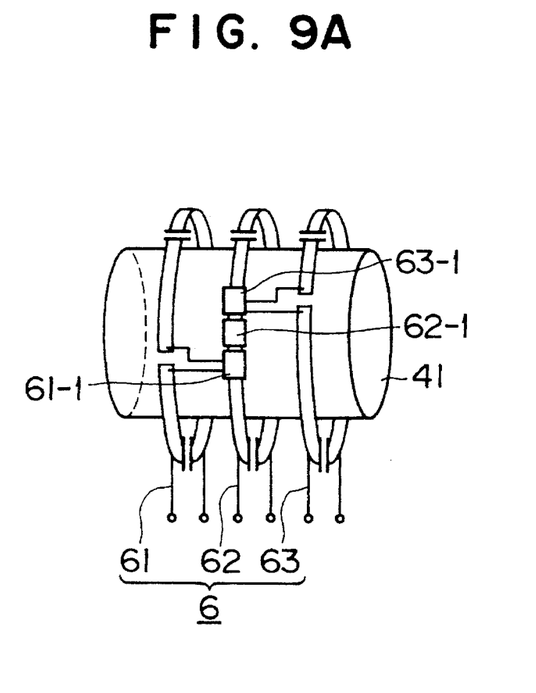
FIG. 9A is a diagram showing still another embodiment of the RF probe according to the present invention.
Figure 9B:
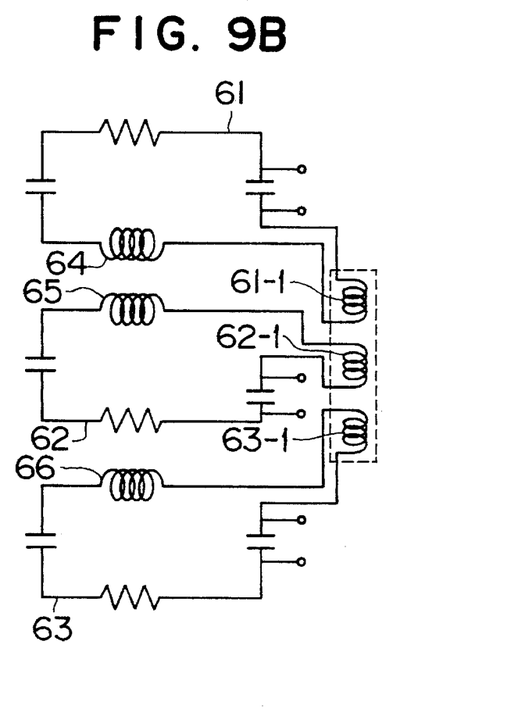
FIG. 9B is an equivalent circuit diagram of the RF probe indicated in FIG. 9A.

FIG. 9A shows still another embodiment of the present invention, in which 3 unit coils are used, and FIG. 9B shows an equivalent circuit thereof. In the present embodiment electromagnetic coupling between an equivalent inductance 64 of a coil 61 and an equivalent inductance 65 of a coil 62 is removed by using electromagnetic coupling (mutual inductance) between inductors 61-1 and 62-1 and electromagnetic coupling between an equivalent inductance 65 of the coil 62 and an equivalent inductance 66 of a coil 63 is removed by using electromagnetic coupling (mutual inductance) between inductors 62-1 and 63-1, similarly to FIG. 4. The electromagnetic coupling between the coils 61 and 63 is generally sufficiently small. However, in case where this gives rise a problem, isolation can be secured by a similar method in addition to that described previously. Construction required for this case is not indicated in the figure. By the construction described above isolation can be effected for each of the coils 61, 62 and 63 constituting the array coil 6.

For concrete examples of the inductors those described in the different embodiments described previously can be used.

Figure 10:
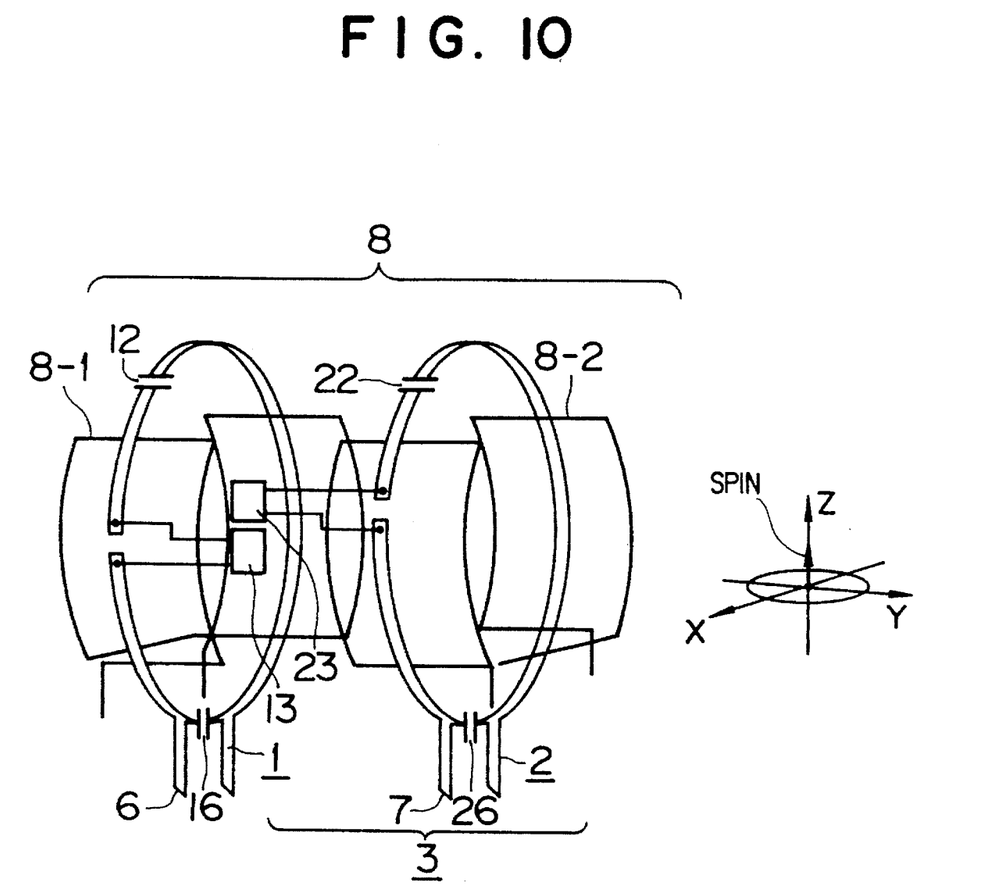
FIG. 10 shows an example, to which the RF probe according to the present invention is applied to a QD probe.

FIG. 10 shows an example, in which the present invention is applied to a QD (quadrature detection) probe. In the present embodiment the array coil 3 consisting of the resonance coils 1 and 2 indicated in FIG. 1 is arranged in the direction of body axis (Y axis) of the subject (not indicated in the figure). In FIG. 10 there are shown the inductors 13 and 23, which are a feature of the present invention, added to the conductive loops. The RF magnetic field produced by the array coil is in the Y direction and the static magnetic field is in the Z direction. When a QD probe is formed, a coil producing an RF magnetic field in the X direction is necessary. In the present embodiment the RF magnetic field in the X direction is generated by using a saddle type array coil 8 consisting of saddle type coils 8-1 and 8-2. In order to secure isolation between the unit saddle type coils, isolation between the saddle type coils can be secured similarly to the embodiment indicated in FIG. 1, i.e. by connecting inductors with the saddle type coils in series and by using electromagnetic coupling between the inductors. However, since coupling between different coils is small for a saddle type array coil, a method well-known heretofore may be used, by which electromagnetic coupling is removed by overlapping only slightly every two of a plurality of saddle type coils. In the present embodiment, since the QD is realized by using two groups of array coils, a probe thus obtained has a feature to have an overall S/N ratio extremely high and a wide field of view. Further it can be utilized also as a switchable coil for a neck and head portion by switching over the unit saddle coils 8-1, 8-2 and the unit resonance coils 1, 2 by means of a switch, etc.

Figure 11:
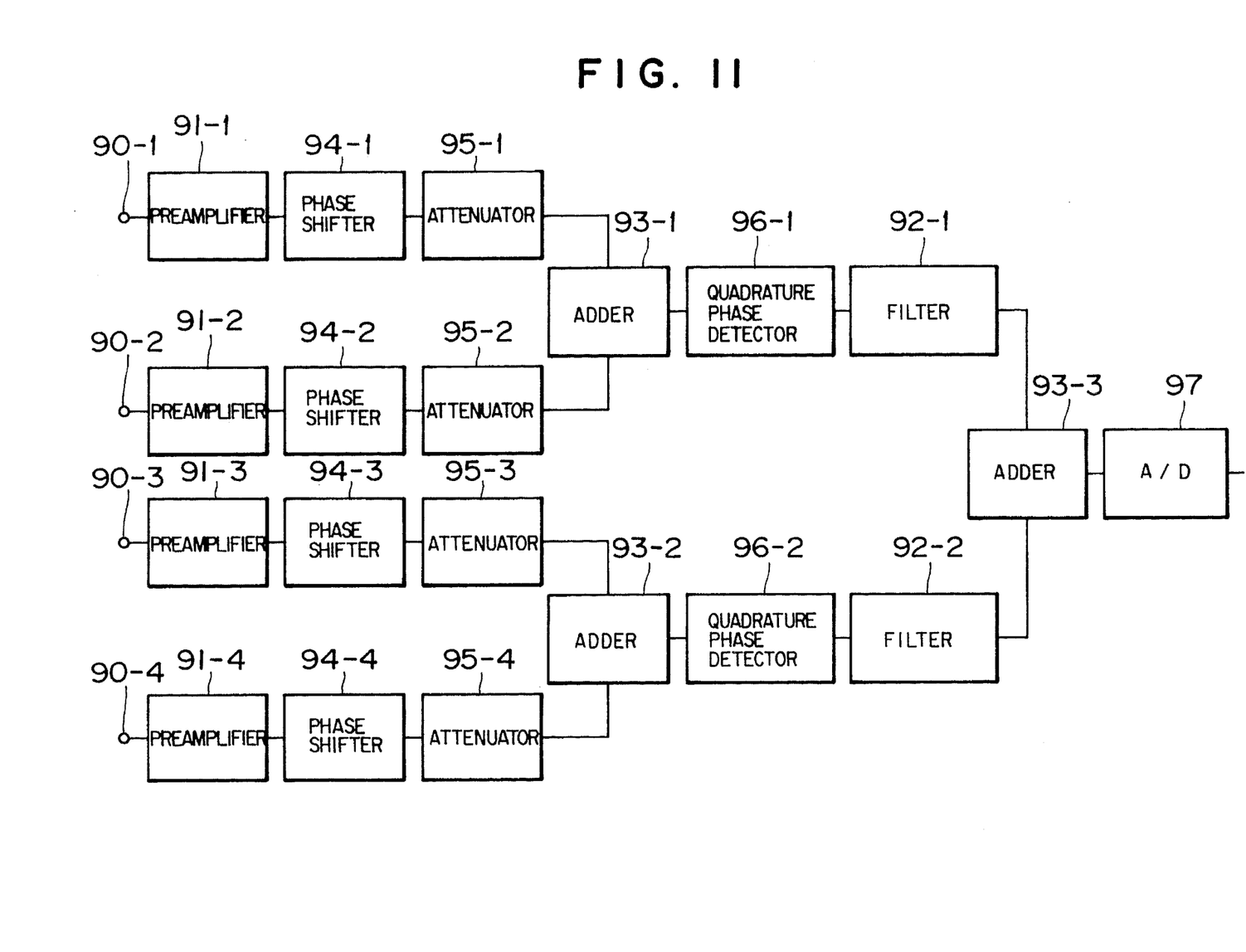
FIG. 11 is a block diagram showing an example of a receiving system in the QD probe indicated in FIG. 10.

FIG. 11 is a block diagram of an example of the receiving system suitable for the QD probe indicated in FIG. 10. Signals from the unit saddle type coil 8-1 and the unit resonance coil 1 (refer to FIG. 10) are inputted to input terminals 90-1 and 90-2, respectively, while signals from the unit saddle type coil 8-2 and the unit resonance coil 2 (refer to FIG. 10) are inputted to input terminals 90-3 and 90-4, respectively. The signals inputted to the input terminals 90-1, 90-2, 90-3 and 90-4 are amplified by preamplifiers 91-1, 91-2, 91-3 and 91-4, respectively. The phases of outputs from the preamplifiers 91-1 and 91-2 (and 91-3 and 91-4) are regulated by phase shifters 94-1 and 94-2 (and 94-3 and 94-4), respectively, so that they are in a same phase. More concretely speaking, the amount of this phase shift is set e.g. to 0° for the phase shifter 94-1 (and 94-3) and +90° or −90° for the phase shifter 94-2 (and 94-4). Next gains for outputs of the phase shifter 94-1 and 94-2 (94-3 and 94-4) are regulated by attenuators 95-1 and 95-2 (95-3 and 95-4), respectively, so as to be in an optimum state. Outputs of the attenuators 95-1 and 95-2 (95-3 and 95-4) are added by an adder 93-1 (93-2). The output of the adder 93-1 (93-2) is connected with a quadrature phase detector 96-1 (96-2). Outputs of the quadrature phase detectors 96-1 and 96-2 are assigned to different frequency regions, added by an adder 93-3, after noise in unnecessary frequency regions has been eliminated by a filter 92-1 (92-2), and then converted into a digital signal by an A/D converter 97. The filters 92-1 and 92-2 as well as the adder 93-3 can be substituted by an analogue high speed switch. Further the output signals of the quadrature phase detectors 96-1 and 96-2 may be added in a digital manner after having been directly A/D-converted. In the present embodiment signals from respective coils arranged in a quadratic manner such as the unit saddle coil 8-1 and the unit resonance coil 1 as well as the unit saddle coil 8-2 and the unit resonance coil 2 are regulated in the phase and the gain and added and thereafter added signals thus obtained for respective coils arranged in a quadratic manner are added further. In this way quadrature detection can be realized stably by the array coil.

Figure 12:
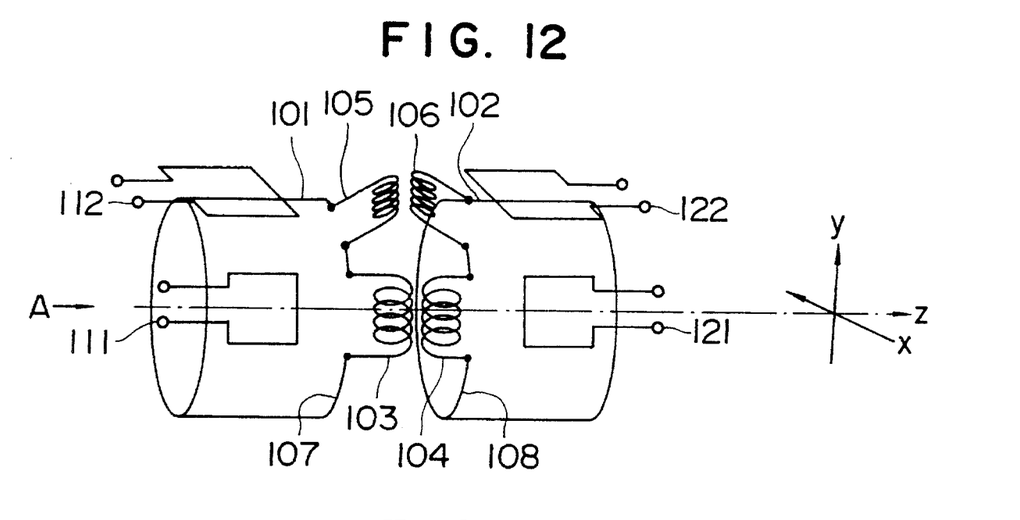
FIG. 12 shows an example, to which the RF probe according to the present invention is applied to a multiple element resonator.
Figure 13:
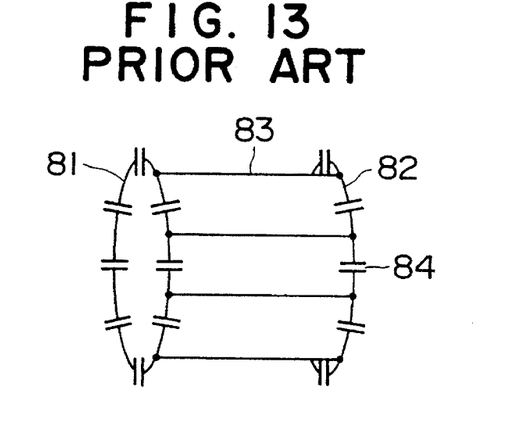
FIG. 13 is a diagram showing the construction of a general multiple element resonator.

FIG. 12 shows an example, in which the present invention is applied to a multiple element resonator (MER). In the present embodiment, in a composite type RF probe for MRI consisting of at least two MERs 101 and 102 having axes aligned approximately on one straight line in a static magnetic field and diameters approximately equal to each other, two groups of inductors 103 and 104, 105 and 106 connected with conductive loops 107 and 108 at an extremity portion of the MER in series are arranged as decoupling mechanisms for eliminating coupling due to components in the two directions x and y of high frequency magnetic field for the two MERs 101 and 102. In the present embodiment, since coupling of magnetic field in the x direction is removed by a first decoupling mechanism 103 and 104, while coupling of magnetic field in the y direction is removed by a second decoupling mechanism 105 and 106, mutual interference between the MERs can be removed completely and stably even for a rotating magnetic field. The construction of the MER consists of a pair of conductive loop elements 81 and 82 distant from each other along a common axis, a plurality of axial conductive segments (rungs) 83 connecting electrically the conductive loop elements 81 and 82 with each other and a plurality of capacitive elements 84 disposed on the conductive loops, as indicated in FIG. 13. This is called generally a high pass type MER. Feeding and reception of the MER 101 is effected by inductive coupling through pick-up coils, which are given through a port 111 for the x direction and another port 112 for the y direction. On the other hand, feeding and reception of the MER 102 is effected by inductive coupling through pick-up coils, which are given through a port 121 for the x direction and another port 122 for the y direction.

Interference of magnetic field in the x direction is removed by the inductors 103 and 104, while interference of magnetic field in the y direction is removed by the inductors 105 and 106. The inductors 103 and 104 as well as 105 and 106 are arranged closely to each other so as to be electromagnetically coupled.

Figure 14:
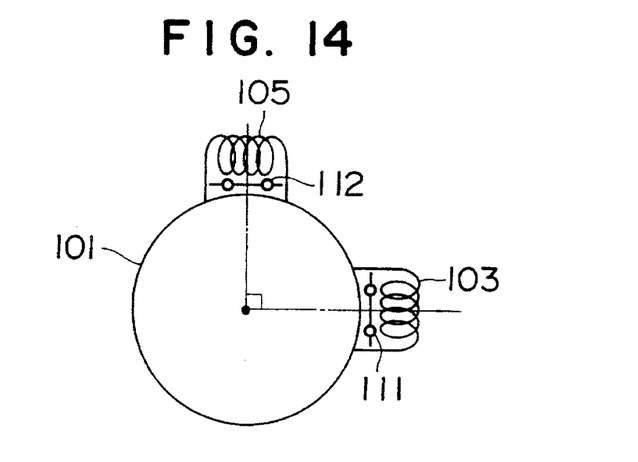
FIG. 14 is a cross-sectional view of the RF probe according to the present invention, viewed in a direction indicated by an arrow A.

FIG. 14 is a cross-sectional view of FIG. 12 viewed in the direction indicated by an arrow A in FIG. 12. As indicated in FIG. 14, the inductor 105 and the inductor 103 are located at positions deviated by 90° from each other in the MER 101 and the pick-up coils 111 and 112 and the inductors 103 and 105 are aligned in same directions, respectively. The corresponding elements in the MER 102 are arranged similarly. These positions, where the inductors are inserted, are portions, where RF current is most strongly concentrated, when they are fed through the respective x and y ports, and where the effect of the present invention is exhibited at best. Although two groups of inductors are used in the present embodiment, four groups of inductors may be used, adding further other inductors at positions opposite to each other.

Now a concrete shape of the MERs 101 and 102 will be described. For example, an MRI probe for imaging a head at 1.5 T has a diameter of 300 mm and a length of 200 mm and the number of rungs 83 is 16. Each of the rungs is made of a copper pipe having a diameter of 3 mm. Each of the capacitive elements has a capacity of about 40 pF. The resonance frequency of the MER is 63.8 MHz (resonance frequency of proton). The impedance of the MER can be easily adjusted at a desired value, e.g. 50 Ω, by regulating the electromagnetic coupling state of the pick-up coils with the body of the MER (varying relative position thereof). The inductors may have a form similar to that explained, e.g. referring to FIG. 5. The construction described above can be applied also to a probe for a whole body, a probe for local use, etc., using prior art techniques in common at need. In the present embodiment interferences in two directions perpendicular to each other are removed independently from each other by means of two decoupling mechanisms. Consequently, since no interference is produced even for rotating magnetic field, it is possible to realize a probe for QD and to raise sensitivity of the probe. Although the QD method was utilized for a transmitting and receiving system in the above explanation, a linear method may be used therefor and a pair of inductors may be used in this case. Further the feeding method for the MER may not be of inductive coupling type but of capacitive coupling type. Apart from the high pass type the MER may be of low pass or band pass type. Also in these cases, portions of the resonator, where current is most strongly concentrated, are selected for portions, where the inductors are inserted. Furthermore the MER may be slotted tube resonator.

Figure 15:
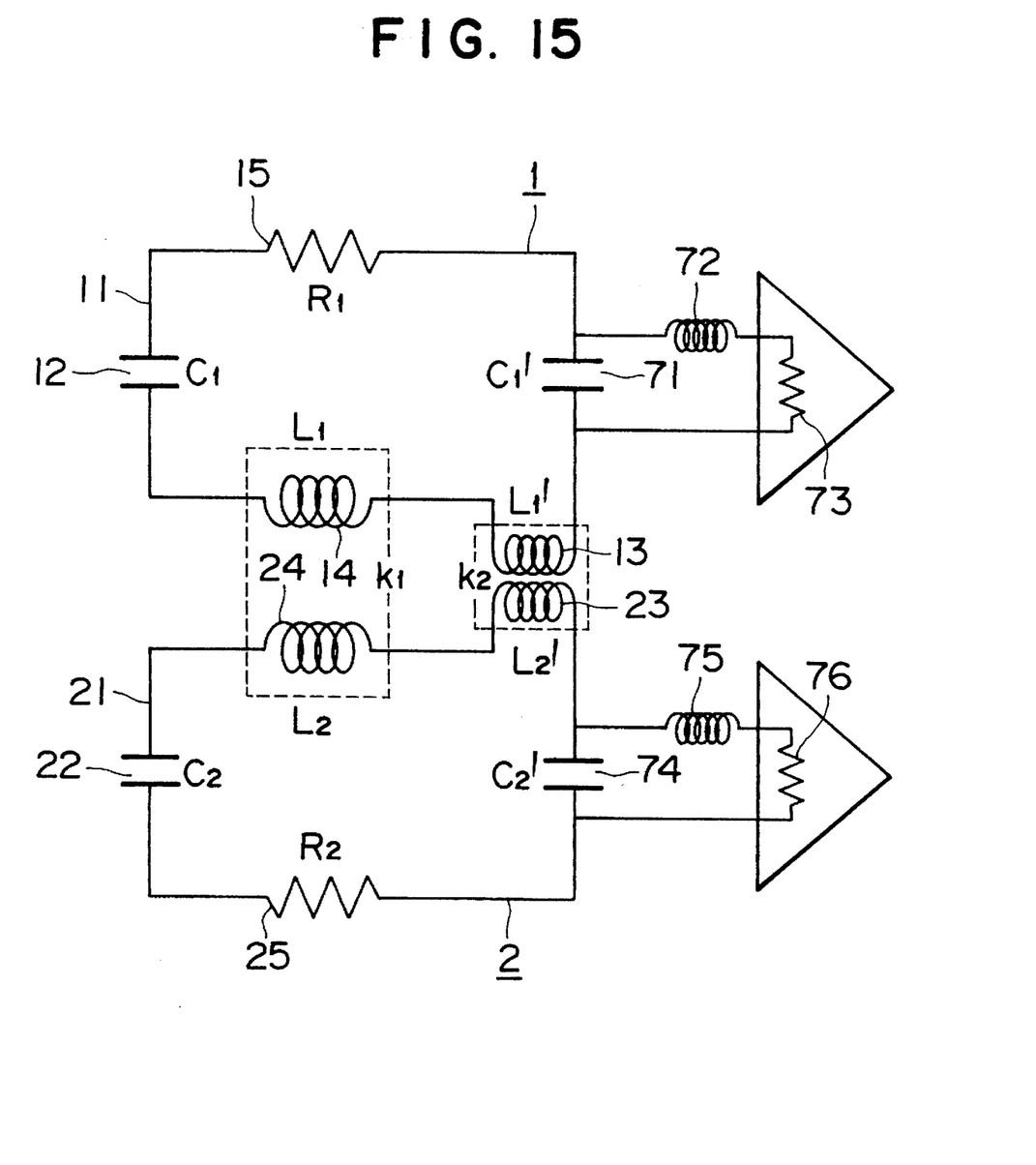
FIG. 15 is a diagram showing an embodiment capable of stabilizing further coil characteristics of the RF probe according to the present invention.

FIG. 15 shows an embodiment for stabilizing further characteristics of coils used in the RF probe according to the present invention. Electromagnetic coupling between different coils can be further decreased by increasing apparent impedance in conductive loops by using an LC circuit consisting of capacitors 71 and 74 and inductors 72 and 75 as well as input impedances 73 and 76 of amplifiers. Consequently the separation state between different coils is stabilized.

Further it is possible to dispose magnetic shield between the subject and the inductors explained in the different embodiments described above and in this way they are hardly influenced from the exterior, which makes them more suitable. The magnetic shield may be plate-shaped or it may be formed so as to enclose the inductors.

In addition the inductors, etc. of the present invention may be disposed also independently from the position where the subject is located, e.g. outside of the static magnetic field.

Furthermore the construction of the RF probe according to the present invention may be suitably modified apart from the embodiments explained in the above. For example, it may be used together with a method, by which isolation is secured by using compensating coils. In addition the unit coils 1 and 2 are not necessarily parallel to each other.

Figure 16:
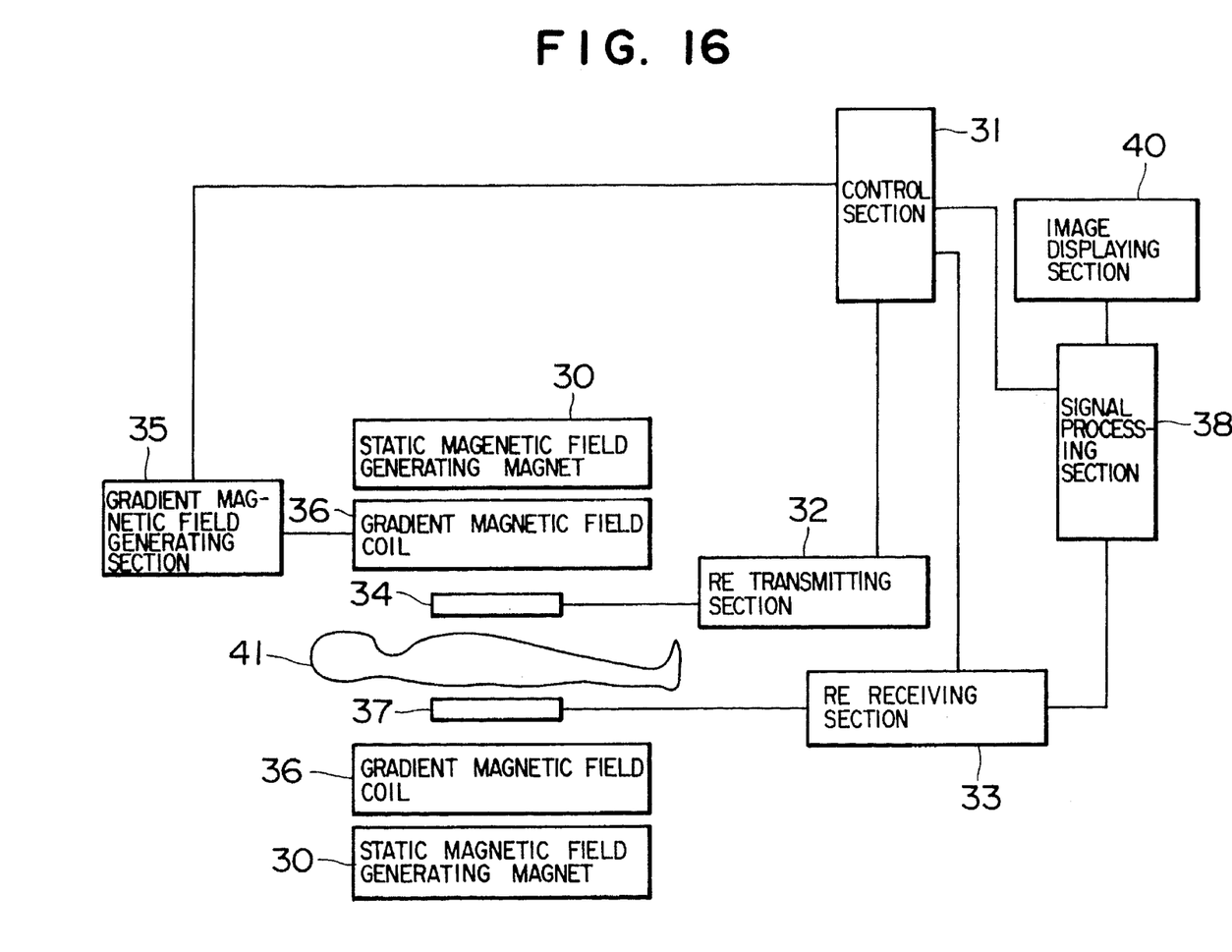
FIG. 16 is a diagram showing the construction of an NMR apparatus using the RF probe according to the present invention.

FIG. 16 shows an example of a nuclear magnetic resonance (NMR) apparatus according to the present invention. This nuclear magnetic resonance apparatus is designed for obtaining a tomographic image of a subject 41, utilizing NMR phenomena, and consists of a static magnetic field generating magnet 30, a signal processing section 38, an RF transmitting section 32, an RF receiving section 33, a gradient magnetic field generating section 35, an image displaying section 40, and a controlling section 31 controlling them. The static magnetic field generating magnet 30 generates an intense and uniform static magnetic field around the subject 41 in a direction perpendicular thereto and it is disposed in a space around the subject 41. An output of the RF transmitting section 32 is transmitted to a transmitting RF probe 34 to generate a high frequency magnetic field (RF magnetic field). An output of the gradient magnetic field generating section 35 is transmitted to gradient magnetic field coils 36 to generate gradient magnetic fields Gx, Gy and Gz in three directions, i.e. X, Y and Z directions. It is possible to set an arbitrary tomographic plane in the subject 41, depending on how to apply the gradient magnetic fields thereto. The RF receiving section 33 receives a signal of a receiving RF probe. RF probes constructed as explained in the different embodiments of the present invention are used for the receiving RF probe 37 and/or the transmitting RF probe 34. An output of the RF receiving section 33 is subjected to processing such as Fourier transformation, reconstruction of image, etc. in the signal processing section 38 and thereafter displayed in the image displaying section 40. The transmitting RF probe 34, the receiving RF probe and the gradient magnetic field coils 36 are disposed in a space around the subject 41.

We claim:

1. An RF probe for MRI comprising:
   a plurality of unit coils, each of said unit coils including a conductive loop, a capacitor for resonance connected in series with the conductive loop, and an inductor connected in series with the conductive loop;
   wherein said unit coils are arranged so that an electromagnetic coupling is produced between at least two of said inductors which are connected to each of said conductive loops so as to compensate for and reduce an electromagnetic coupling of at least two of said conductive loops of at least two of said unit coils.

2. An RF probe according to claim 1, wherein said plurality of unit coils are arranged so that central axes of unit coils perpendicular to planes containing conductive loops are approximately in accordance with each other.

3. An RF probe according to claim 1, wherein said plurality of unit coils are arranged with a certain interval in a direction of an RF magnetic field detected by the different unit coils.

4. An RF probe according to claim 1, wherein said plurality of unit coils are arranged with a certain interval in a direction perpendicular to a direction of an RF magnetic field detected by the different unit coils.

5. An RF probe according to claim 1, wherein said inductors are air-core coils.

6. An RF probe according to claim 5, wherein each of said air-core coils has 1–10 turns.

7. An RF probe according to claim 5, wherein each of said air-core coils has a cross-sectional area of 10–10,000 $mm^2$.

8. An RF probe according to claim 5, wherein each of said air-core coils is made of wire having a cross-sectional area of 3–100 $mm^2$.

9. An RF probe according to claim 1, wherein each of said inductors is arranged so that a direction of magnetic field generated by each of said inductors differs from a direction of magnetic field detected by each of said conductive loops.

10. An RF probe according to claim 1, wherein each of said inductors has an inductance 0.1–3 times as great as inductance of distributed constant of each of said conductive loops.

11. An RF probe according to claim 1, wherein each of said inductors is an 8-shaped inductor.

12. An RF probe according to claim 1, further comprising a magnetic shield in the neighborhood of said inductors.

13. An RF probe according to claim 1, wherein each of said conductive loops constitutes a part of a loop element of a multiple element resonator.

14. An RF probe according to claim 13, wherein said inductors include two groups of inductors, which are arranged so as to be deviated by 90° from each other around a central axis of said multiple element resonator.

15. An RF probe according to claim 1, wherein each of said conductive loops constitutes a part of one of a loop coil, a saddle coil and a solenoid coil.

16. An RF probe according to claim 1, further comprising arranging means for arranging at least two of said inductors so that central axes of said inductors are approximately in accordance with each other.

17. An RF probe according to claim 1, further comprising regulating means for regulating a magnitude of electromagnetic coupling between at least two of said inductors.

18. An RF probe according to claim 17, wherein said regulating means varies distance between said inductors.

19. An RF probe according to claim 17, wherein said regulating means displaces central axes of said inductors.

20. An RF probe according to claim 1, further comprising an auxiliary conductive loop disposed between at least two inductors, said auxiliary conductive loop acts as an intermediary for coupling electromagnetically said inductors.

21. An RF probe according to claim 1, further comprising a second RF probe for detecting a second RF magnetic field perpendicular to direction of a first RF magnetic field detected by said RF probe which is a first RF probe.

22. An RF probe according to claim 21, wherein said second RF probe is-a saddle type coil.

23. An RF probe according to claim 21, wherein said second RF probe is an array coil.

24. An RF probe according to claim 1, wherein a magnitude of the electromagnetic coupling between at least two of said inductors is substantially equal to a magnitude of the electromagnetic coupling between the at least two conductive loops of at least two of said unit coils.

25. A RF probe according to claim 1, wherein each of said unit coils has approximately a same resonance frequency closely to each other.

26. An MRI apparatus comprising:

a receiving RF probe including a plurality of unit coils, each of said unit coils including a conductive loop, a capacitor for resonance connected in series with the conductive loop, and an inductor connected in series with the conductive loop, wherein said unit coils are arranged so that an electromagnetic coupling is produced between at least two said inductors which are connected to each of said conductive loops so as to compensate for and reduce an electromagnetic coupling of at least two said conductive loops of at least two of said unit coils;

means for receiving signals from said receiving RF probe to reconstruct an image;

means for displaying said image;

means for generating a static magnetic field;

means for generating gradient magnetic fields; and means for generating an RF magnetic field.

27. An RF probe according to claim 26, wherein a magnitude of the electromagnetic coupling between at least two of said inductors is substantially equal to a magnitude of the electromagnetic coupling between at least two the conductive loops of at least two of said unit coils.

28. An MRI apparatus according to claim 26, wherein said means for generating an RF magnetic field comprises:

a plurality of unit coils, each of said unit coils including a conductive loop, a capacitor for resonance connected in series with the conductive loop, and an inductor connected in series with the conductive loop, wherein said unit coils are arranged so that an electromagnetic coupling is produced between at least two of said inductors which are connected to each of said conductive loops so as to compensate for and reduce an electromagnetic coupling of at least two of said conductive loops of at least two of said unit coils.

29. An RF probe according to claim 28, wherein a magnitude of the electromagnetic coupling between at least two of said inductors is substantially equal to a magnitude of the electromagnetic coupling between the conductive loops of at least two of said unit coils.

30. An MRI apparatus comprising:

means for generating an RF magnetic field including a plurality of unit coils, each of said unit coils including a conductive loop, a capacitor for resonance connected in series with the conductive loop, and an inductor connected in series with the conductive loop, wherein said unit coils are arranged so that an electromagnetic coupling is produced between at least two of said inductors which are connected to each of said conductive loops so as to compensate for and reduce an electromagnetic coupling of at least two of said conductive loops of at least two of said unit coils;

means for giving rise to electromagnetic coupling between at least two of said inductors;

a receiving RF probe;

means for receiving signals from said receiving RF probe to reconstruct an image;

means for displaying said image;

means for generating a static magnetic field; and means for generating gradient magnetic fields.

31. An RF probe according to claim 30, wherein a magnitude of the electromagnetic coupling between at least two of said inductors is substantially equal to a magnitude of the electromagnetic coupling between the conductive loops of at least two of said unit coils.

32. An MRI comprising:

a receiving RF probe including a plurality of unit coils, each of said unit coils including a conductive loop, a capacitor for resonance connected in series with the conductive loop, and an inductor connected in series with the conductive loop, wherein said unit coils are arranged so that an electromagnetic coupling is produced between at least two of said inductors which are connected to each of said conductive loops so as to compensate for and reduce an electromagnetic coupling of at least two of said conductive loops of at least two of said unit coils;

means for regulating a magnitude of the electromagnetic coupling between at least two of said inductors;

means for receiving signals from said receiving RF probe to reconstruct an image;

means for displaying said image;

means for generating a static magnetic field;

means for generating gradient magnetic fields; and means for generating an RF magnetic field.

33. An MRI comprising:

means for generating an RF magnetic field including a plurality of unit coils, each of said unit coils including a conductive loop, a capacitor for resonance connected in series with the conductive loop, and an inductor connected in series with the conductive loop, wherein said unit coils are arranged so that an electromagnetic coupling is produced between at least two of said inductors which are connected to each of said conductive loops so as to compensate for and reduce an electromagnetic coupling of at least two of said conductive loops of at least two of said unit coils;

means for regulating a magnitude of the electromagnetic coupling between at least two of said inductors;

means for receiving signals from said receiving RF probe to reconstruct an image;

means for displaying said image;

means for generating a static magnetic field; and means for generating gradient magnetic fields.

34. An RF probe for MRI comprising a plurality of unit coils, each of said unit coils including a conductive loop, a capacitor for resonance connected in series with the conductive loop, and an inductor connected in series with the conductive loop, wherein said unit coils are arranged proximate to each other so as to reduce an electromagnetic coupling of at least two of said unit coils.

* * * * *